(12) United States Patent
Mostovoy et al.

(10) Patent No.: US 6,428,663 B1
(45) Date of Patent: Aug. 6, 2002

(54) PREVENTING DEFECT GENERATION FROM TARGETS THROUGH APPLYING METAL SPRAY COATINGS ON SIDEWALLS

(75) Inventors: Roman Mostovoy, San Francisco; Glen T. Mori, Pacifica, both of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/609,127

(22) Filed: Jul. 3, 2000

(51) Int. Cl.[7] ............................ C23C 14/34; C23C 4/08; B05D 1/02; B05D 1/08
(52) U.S. Cl. ................. 204/298.12; 427/446; 427/455; 427/456; 427/421; 427/445
(58) Field of Search .................. 204/298.12; 427/446, 427/455, 456, 421, 445; 428/411.1, 457

(56) References Cited

U.S. PATENT DOCUMENTS

| | | | |
|---|---|---|---|
| 4,904,542 A | 2/1990 | Mroczkowski | 428/610 |
| 5,135,629 A | 8/1992 | Sawada et al. | 204/192.12 |
| 5,178,739 A | * 1/1993 | Barnes et al. | 204/192.12 |
| 5,482,612 A | 1/1996 | Armstrong et al. | 204/298.11 |
| 5,527,438 A | 6/1996 | Tepman | 204/192.12 |
| 5,914,018 A | 6/1999 | Fu et al. | 204/298.12 |
| 6,030,514 A | * 2/2000 | Dunlop et al. | 204/298.12 |

FOREIGN PATENT DOCUMENTS

| | | | |
|---|---|---|---|
| EP | 0 401 035 | 12/1990 | C23C/14/22 |
| EP | 0 584 483 A1 | 3/1994 | C23C/14/00 |
| JP | 63-317666 | * 12/1988 | C23C/14/34 |
| JP | 2-277767 | * 11/1990 | C23C/14/34 |
| JP | 9-287072 | * 11/1997 | C23C/14/34 |

OTHER PUBLICATIONS

"Characterizating Thermal Spray Coatings," p. 23–27, *Advanced Materials & Processes*, vol. 141, No. 5, May 1992 (staff report).

* cited by examiner

Primary Examiner—Steven H. VerSteeg

(57) ABSTRACT

A coating layer is applied to a semiconductor device fabrication equipment, specifically, to a sidesurface of an inventive target. Characteristics of the coating layer promote adhesion of sputtered particles which may accumulate on the deposition equipment surface. The coating layer therefore reduces the probability that sputtered particles will flake or crumble from the equipment and contaminate a substrate being processed therein.

15 Claims, 2 Drawing Sheets

PREVENTING DEFECT GENERATION FROM TARGETS THROUGH APPLYING METAL SPRAY COATINGS ON SIDEWALLS

FIELD OF THE INVENTION

The present invention relates to apparatuses and methods for the fabrication of semiconductor devices. More particularly, the present invention relates to a target that deposits a material layer on a semiconductor device.

BACKGROUND OF THE INVENTION

Sputtering is a method of depositing a material layer on a semiconductor substrate. A typical sputtering apparatus includes a target and a substrate support pedestal enclosed in a sputtering chamber. The target contains a material that is deposited on a substrate. The target is typically affixed to the top of the sputtering chamber, but is electrically isolated from the sputtering chamber walls. A voltage source maintains the target at a negative voltage with respect to the sputtering chamber walls, creating a voltage differential which excites a gas contained within the sputtering chamber into a plasma. Plasma ions are generated and directed to the target where plasma ion momentum transfers to target atoms, causing the target atoms to be ejected (i.e., to sputter) from the target. The sputtered target atoms deposit on the substrate, thereby forming a thin film.

However, a portion of the sputtered target atoms become scattered in the plasma and eventually accumulate on other surfaces within the sputtering chamber, including the sidesurfaces of the target. The sputtered target atoms, which do not directly deposit on the substrate, are referred to as sputtered particles. A portion of the sputtered particles may tend to flake or crumble off the sidesurfaces of the target as the sputtering chamber thermally cycles, particularly when a significant amount of sputtered particles has accumulated thereon. Such flaking or crumbling sputtered particles may settle on, and thereby contaminate the substrate. Accordingly, in order to reduce this type of contamination, a need exists in the semiconductor fabrication field for an apparatus and method that reduces substrate contamination that occurs due to flaking or crumbling of sputtered particles which accumulate on the sidesurfaces of the target.

SUMMARY OF THE INVENTION

The present invention provides an inventive target having a front surface and one or more sidesurfaces. A coating layer is applied to the inventive sputtering target's sidesurface. Characteristics of the coating layer promote adhesion between the sputtering target's sidesurfaces and sputtered particles which may accumulate thereon, thus preventing the accumulated sputtered particles from flaking off or crumbling off the sidesurfaces of the inventive sputtering target and settling onto a substrate positioned therebelow. Accordingly, the present invention may reduce substrate contamination, thereby increasing sputtering chamber yield and reducing substrate costs. In a further aspect, the coating may also be applied to a portion of the target's backing plate.

Other, features and advantages of the present invention will become more fully apparent from the following detailed description of the preferred embodiments, the appended claims and the accompanying drawings.

DETAILED DESCRIPTION OF THE PREFERRED EMBODIMENTS

The present invention provides an inventive target that may reduce substrate contamination that occurs due to flaking or crumbling of substrate particles accumulated thereon. In order to fully understand the inventive target, it is necessary to first describe a conventional sputtering chamber such as that illustrated in FIG. 1.

Figure 1:
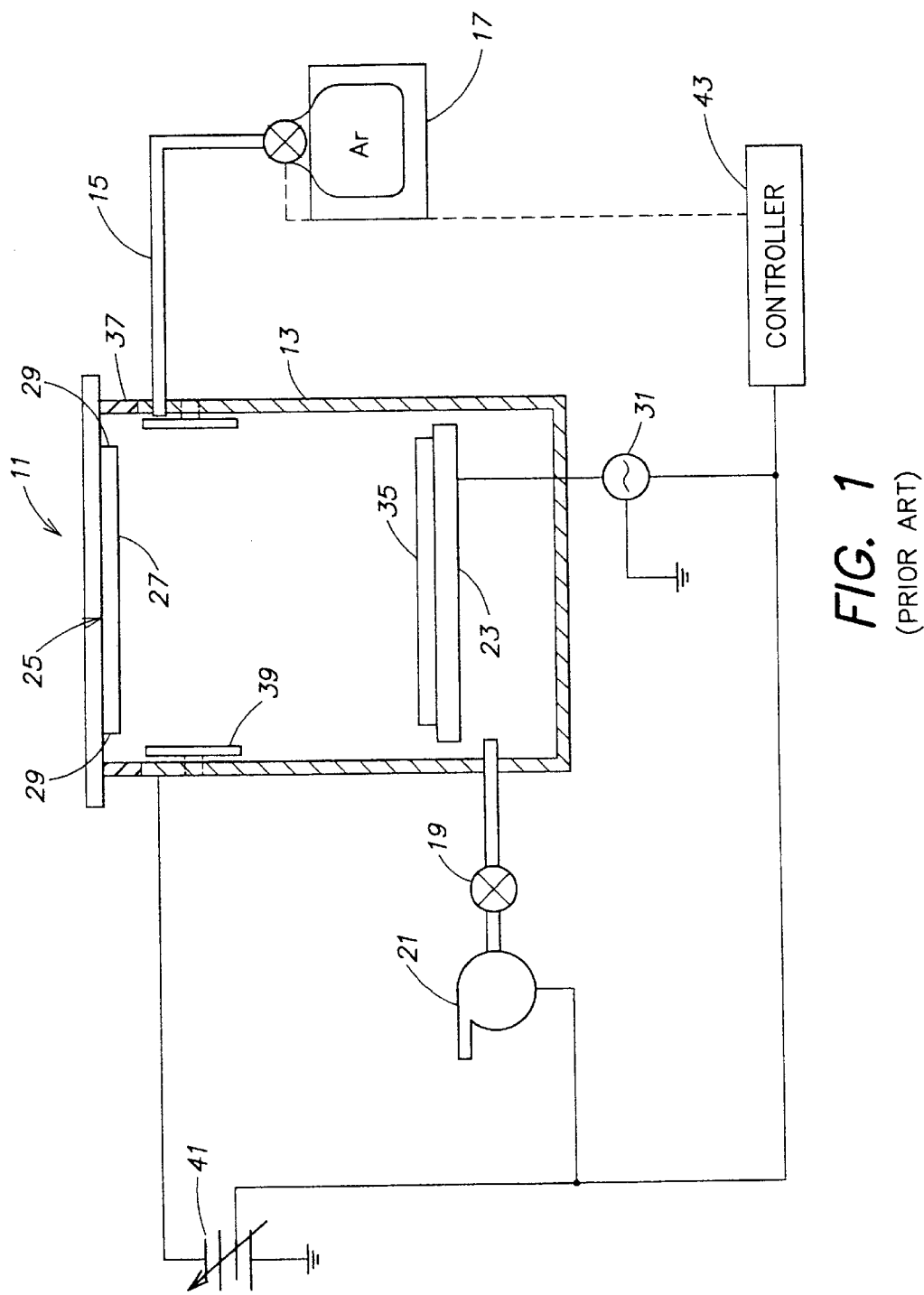
FIG. 1 is a diagrammatic side view of a conventional sputtering chamber.

FIG. 1 is a diagrammatic illustration of a conventional sputtering chamber 11. The sputtering chamber 11 generally includes a sputtering chamber enclosure wall 13 having at least one gas inlet 15 coupled to a processing gas source 17, and an exhaust outlet 19 coupled to an exhaust pump 21. A substrate support pedestal 23 is disposed in the lower portion of the sputtering chamber 11, and a target 25 is mounted to or forms the upper portion of the sputtering chamber 11 as is conventionally known. The target 25 has a front surface 27 and at least one sidesurface 29. Typically, targets are disk shaped, and thus have a single, circumferential side surface 29. An AC power supply 31 is operatively coupled to the substrate support pedestal 23 so that an AC power signal emitted from the AC power supply 31 may couple through the substrate support pedestal 23 to a substrate 35 positioned thereon.

The target 25 is electrically isolated from the sputtering chamber enclosure wall 13 by an insulation member 37. Any sputtered particles, which accumulate on the insulation member 37, may cause an electrical short circuit between the sputtering chamber enclosure wall 13 and the target 25. Such an electrical short circuit may cause the sputtering chamber 11 to malfunction. Therefore, a shield 39 is positioned to prevent sputtered particles from accumulating on the insulation member 37 and also to prevent particles from accumulating on the sputtering chamber enclosure surface 13 as particles may crumble therefrom creating a potential source of substrate contamination.

The sputtering chamber enclosure wall 13 is preferably grounded so that a negative voltage may be maintained on the target 25 (with respect to grounded sputtering chamber enclosure wall 13) via a DC power supply 41. A controller 43 is operatively coupled to the DC power supply 41, the gas inlet 15, the exhaust outlet 19, and the AC power supply 31.

In operation, during sputtering, a gas (typically argon) is charged into the sputtering chamber 11 through the gas inlet 15 at a selected flow rate regulated by the controller 43. The controller 43 also regulates the sputtering chamber pressure by throttling the rate at which the gas is pumped through the exhaust outlet 19. Accordingly, although a constant chamber pressure is maintained during sputtering, a continuous supply of fresh processing gas is supplied to the sputtering chamber 11.

The D.C. power supply 41 applies a negative voltage to the target 25 with respect to the sputtering chamber enclosure wall 13 so as to excite the processing gas into a plasma state. Ions from the plasma bombard the target 25, causing the target atoms to sputter therefrom. The sputtered target atoms travel along linear trajectories from the target 25 and deposit on the substrate 35.

A portion of the sputtered target atoms become scattered in the plasma and eventually accumulate on other surfaces within the sputtering chamber 11, including the sidesurface 29 of the target 25. As stated previously, the sputtered target atoms, which do not deposit on the substrate, are referred to herein as sputtered particles. A portion of sputtered particles, which is not strongly adhered to the sidesurface 29 of the target 25, may flake or crumble therefrom as the sputtering chamber 11 thermally cycles. Such flaking or crumbling sputtered particles may settle on, and thereby contaminate the substrate 35.

Various approaches have been employed in an effort to reduce the contamination of substrates that occurs due to sputtered particles flaking or crumbling from the sidesurface 29 of the target 25. For example, one method involves bead-blasting the sidesurface 29 of the target 25 with beads. Bead-blasting increases the roughness of the sidesurface 29. Typically, bead-blasting creates a surface roughness $R_A$ around 200 micro inch. Roughing the target's sidesurface 29 increases adhesion between the sidesurface 29 and sputtered particles accumulated thereon. Accordingly, bead-blasting allows the sputtered particles to adhere more strongly to the sidesurface 29 of the target 25, and the sputtered particles are less likely to flake or crumble therefrom.

Beads from the bead blasting process, however, can become embedded in the target's sidesurface 29 and during subsequent processing may become dislodged therefrom as the sputtering chamber 11 and the target 25 thermally cycle. Such dislodged beads may settle on the substrate 35 and, due to the size of the beads may cause potentially catastrophic substrate contamination.

Another method involves periodically etching the sidesurface 29 of the target 25 to increase the roughness thereof. Such periodic etching causes increased chamber downtime, reduced throughput, and increased maintenance costs. Further, etching requires additional auxiliary equipment which increases the overall system cost.

Thus, an improved method is needed to reduce substrate contamination that occurs due to flaking or crumbling of sputtered particles which accumulate on the sidesurface 29 of the target 25, without decreasing productivity or increasing the overall system cost.

Figure 2:
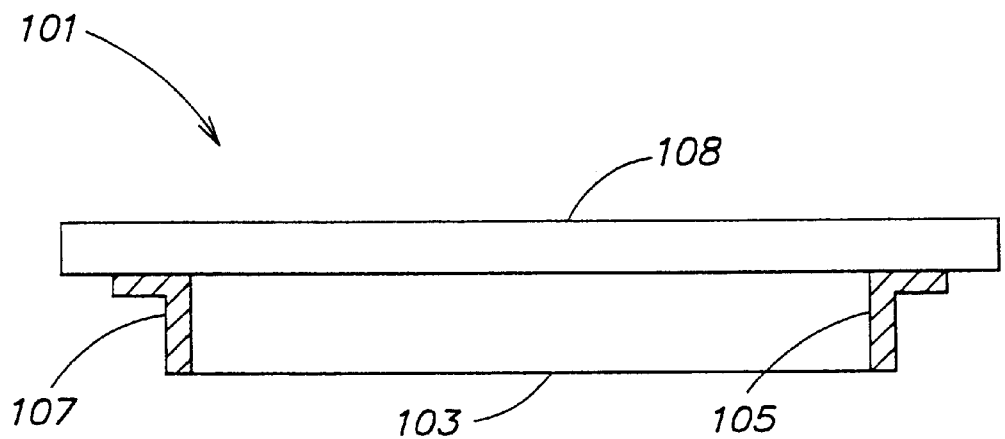
FIG. 2 is a side view of an inventive target for use in the sputtering chamber of FIG. 1.

FIG. 2 is a side view of an inventive target 101. The inventive target 101 has a front surface 103 and a sidesurface 105. A coating 107 is applied to the sidesurface 105 of the inventive target 101. The coating 107 is preferably a metal spray coating (i.e., a metal coating applied via a spray method), as such coatings conventionally have a rough surface finish. The coating 107 preferably has a surface roughness ($R_A$) greater than 200 micro inches. The coating may also be applied to a portion of the target's backing plate 108 as shown in FIG. 2.

The coating 107 may be applied via methods such as flame spraying, arc spraying, thermal spraying, and plasma spraying, all of which are conventionally known to those of ordinary skill in the art. To apply the coating, target surfaces which are not to be coated are covered with a mask which is removed after the coating 107 is applied to the target 101's sidesurface 105. The coating 107 is preferably of sufficient thickness so as to prevent crumbling of sputtered particles. Although the thickness will depend on the specific sputtering process being performed, for most processes coating thicknesses greater than 200 nm (e.g., in the range of 200 nm–1100 nm) is sufficient. Further, the coating 107 comprises a material having a thermal coefficient of expansion similar to that of the sputtered particles accumulated on the sidesurface 105 of the inventive target 101. Most preferably the coating 107 comprises the same material as the target 101; for example, if the inventive target material is aluminum, the coating 107 may be flame sprayed aluminum or may be a flame sprayed composite material which contains aluminum.

In operation, during sputtering, a gas (typically argon), is charged into the sputtering chamber 11 (FIG. 1) through the gas inlet 15 (FIG. 1) at a selected flow rate regulated by the controller 43 (FIG. 1). The D.C. power supply 41 (FIG. 1) applies a negative voltage to the inventive target 101 with respect to the sputtering chamber enclosure wall 13 (FIG. 1) so as to excite the processing gas into a plasma state. Ions from the plasma bombard the inventive target 101 causing the target atoms to sputter therefrom. The sputtered target atoms travel along linear trajectories from the inventive target 101 and deposit on the substrate 35 (FIG. 1). A portion of the sputtered target atoms become scattered in the plasma and eventually accumulate on other surfaces within the sputtering chamber 11 (FIG. 1), including the coated sidesurface 105 of the inventive target 101. As stated previously, the sputtered target atoms which do not deposit on the substrate are referred to as sputtered particles.

The roughness of the coating 107 may significantly increase adhesion between the sidesurface 105 of the inventive target 101 and the sputtered particles accumulated thereon. Accordingly, the coating 107 may allow the sputtered particles to adhere strongly to the sidesurface 105 of the inventive target 101, and may prevent the sputtered particles from flaking off or crumbling therefrom as the sputtering chamber 11 and the inventive target 101 (FIG. 1) thermally cycle.

With use of the present invention, greater than 600 kWh of sputtering may occur without needing target replacement due to flaking or crumbling of accumulated material from the sidesurface 105 of the inventive target 101. Thus, an improvement may be realized over prior art targets that may exhibit flaking or crumbling of accumulated material from bead blasted target sidesurfaces at least as early as 250 kWh. The kWh is a measure of target erosion. Accordingly, the present invention may reduce substrate contamination and may eliminate the need for bead-blasting or etching, thereby increasing deposition chamber yield and reducing substrate costs.

The foregoing description discloses only the preferred embodiments of the invention, modifications of the above disclosed apparatus and method which fall within the scope of the invention will be readily apparent to those of ordinary skill in the art. For instance, although the present invention has been described primarily as applied to a target, any surface within the sputtering chamber 11 may benefit from use of the present invention. The invention may also be used within a conventional high-density plasma-type sputtering chamber having a coil (not shown).

Accordingly, while the present invention has been disclosed in connection with the preferred embodiments thereof, it should be understood that there may be other embodiments which fall within the spirit and scope of the invention, as defined by the following claims.

The invention claimed is:

1. A sputtering target comprising:
   a front surface adapted to face a substrate support;
   at least one sidesurface coupled to the front surface; and
   a coating formed on the sidesurface to promote adhesion of sputtered particles to the sidesurface.

2. The sputtering target of claim 1 wherein the coating comprises a metal spray coating.

3. The sputtering target of claim 2 wherein the metal spray coating comprises a surface finish of greater than 200 nm.

4. The sputtering target of claim 1 wherein the coating and the front surface comprise the same material.

5. An apparatus adapted to deposit layers, comprising:
a sputtering chamber;
a substrate support pedestal enclosed within the sputtering chamber; and
the sputtering target of claim 1 wherein the front surface faces the substrate support pedestal.

6. A method of making a sputtering target comprising:
providing a sputtering target having a front surface and at least one side surface; and
forming a coating on the side surface to promote adhesion of sputtered particles to the side surface.

7. The method of claim 6 wherein forming a coating comprises spraying the coating onto the sidesurface of the sputtering target.

8. The method of claim 7 wherein the coating is a metal.

9. The method of claim 8 wherein the coating has a surface finish of at least 200 micro inches.

10. The method of claim 6 wherein the coating is a metal.

11. The method of claim/ wherein the coating has a surface finish of at least 200 micro inches.

12. The method of claim 6 wherein the coating has a surface finish of at least 200 micro inches.

13. The method of claim 6 wherein the sputtering target and the coating comprise the same material.

14. The method of claim 6 wherein the sputtering target is aluminum and the coating is sprayed aluminum.

15. The method of claim 14 wherein the sprayed aluminum coating has a surface finish of at least 200 micro inches.

* * * * *